(12) United States Patent  (10) Patent No.: US 8,269,905 B2
Hiromasu  (45) Date of Patent: Sep. 18, 2012

(54) ELECTRONIC DEVICE, MANUFACTURING METHOD OF THE SAME AND ELECTRONIC APPARATUS

(75) Inventor: Yasunobu Hiromasu, Kanagawa (JP)

(73) Assignee: Sony Corporation, Tokyo (JP)

( * ) Notice: Subject to any disclaimer, the term of this patent is extended or adjusted under 35 U.S.C. 154(b) by 920 days.

(21) Appl. No.: 12/211,252

(22) Filed: Sep. 16, 2008

(65) Prior Publication Data

US 2009/0085843 A1  Apr. 2, 2009

(30) Foreign Application Priority Data

Sep. 27, 2007  (JP) ................................. 2007-250649

(51) Int. Cl.
 *G02F 1/1333* (2006.01)
(52) U.S. Cl. ......................................... 349/40; 349/110
(58) Field of Classification Search ................ 349/40, 349/110
 See application file for complete search history.

(56) References Cited

U.S. PATENT DOCUMENTS

| 7,477,334 | B2 * | 1/2009 | Moriwaki et al. | 349/40 |
| 2008/0136986 | A1 * | 6/2008 | Kim et al. | 349/40 |
| 2008/0278648 | A1 * | 11/2008 | Chang | 349/40 |
| 2009/0141205 | A1 * | 6/2009 | Park | 349/40 |

FOREIGN PATENT DOCUMENTS

| JP | 07-161994 | | 6/1995 |
| JP | 07161994 | A * | 6/1995 |
| JP | 2579427 | | 11/1996 |
| JP | 10-189996 | | 7/1998 |
| JP | 11-072806 | | 3/1999 |
| JP | 3111944 | | 9/2000 |
| JP | 3429775 | | 5/2003 |
| JP | 2004-538512 | | 12/2005 |

\* cited by examiner

*Primary Examiner* — Nathanael R Briggs
(74) *Attorney, Agent, or Firm* — SNR Denton US LLP

(57) ABSTRACT

Disclosed herein is an electronic device including, an active matrix region, a short-circuit line, electrostatic protection elements, and a light-shielding film.

4 Claims, 10 Drawing Sheets

ELECTRONIC DEVICE, MANUFACTURING METHOD OF THE SAME AND ELECTRONIC APPARATUS

CROSS REFERENCES TO RELATED APPLICATIONS

The present invention contains subject matter related to Japanese Patent Application JP 2007-250649 filed in the Japan Patent Office on Sep. 27, 2007, the entire contents of which being incorporated herein by reference.

1. Field of the Invention

The present invention relates to an electronic device having an active matrix region, manufacturing method of the same and an electronic apparatus.

2. Description of the Related Art

Recent years have seen attention focused on the organic EL display, a display designed to display an image using the phenomenon of organic electroluminescence, as one of the flat panel displays. The organic EL display offers a wide view angle by using the light emitting phenomenon of the organic light-emitting element itself. Besides, the organic EL display is low in power consumption. These features make the display superior in performance. In particular, the organic EL display is considered to provide sufficiently fast response to a high-definition high-speed video signal. As a result, development efforts are underway for commercialization thereof in the video and other fields.

An active matrix organic EL display primarily has a drive panel and sealing panel disposed to be opposed to each other. The drive panel includes organic light-emitting elements and thin film transistors (TFTs) adapted to drive the organic light-emitting elements. The drive and sealing panels are attached together with adhesive so as to sandwich the organic light-emitting elements.

In the TFT manufacturing step used for the active matrix organic EL display, peeling electrification occurs when the insulating substrate is removed from the substrate stage. Further, the conductive thin film is charged up in the film forming and etching steps. As a result, a high voltage is applied momentarily to a specific scan line or signal line, causing a short circuit between the scan and signal lines. Otherwise, this may result in deterioration of the TFT characteristics.

As a solution to the above problem, it is known to connect the scan and signal lines to common wirings via switching elements so as to establish connection between the scan and signal lines and common wirings only if a high potential difference develops which is equal to or greater than a potential difference based on the normal operation. This configuration eliminates the need to cut off the wiring in the final step, thus making it possible to reduce defects caused by static electricity throughout all steps, from the TFT step to final step. However, the common wirings remain unremoved even during the apparatus operation. This has led to increased power consumption during operation caused by leakage current between the scan or signal line and common wiring via the switching element.

There are some Patent documents describe the solutions to the above problem. Here, the solution described in Japanese Patent Laid-Open No. Hei 11-72806 is characterized as follows. That is, the common wiring for the scan lines and the common wiring for the signal lines are connected together via a switching element. The scan lines are connected to the common wiring for the scan lines via switching elements. The signal lines are connected to the common wiring for the signal lines via switching elements. As a result, the common electrodes for the scan lines are adjusted substantially to the OFF voltage of the scan lines. This endures reduced manufacturing defects caused by static electricity. This also provides minimal leakage current from each of the scan lines to the common wiring for the scan lines via the switching elements, thus ensuring reduced power consumption.

On the other hand, the solutions described in Japanese Patent No. 3429775, Japanese Patent No. 3111944 and Japanese Patent No. 2579427 also properly adjust the potentials of the common wirings for the scan and signal lines, thus providing reduced manufacturing defects caused by static electricity and ensuring reduced power consumption.

The feature common to the above solutions is that the driving method for the active matrix liquid crystal display is employed. This driving method sequentially selects the scan lines one at a time to apply the ON voltage so as to turn ON the TFTs. At any other time, the OFF voltage is applied to the scan lines to maintain the TFTs OFF.

In the meantime, JP-T-2004-538512 discloses a method which disposes two common wirings and applies proper voltages respectively to the two wirings so as to prevent application of a voltage beyond Vth to the switching elements, thus suppressing leakage current of the switching elements.

On the other hand, Japanese Patent Laid-Open No. Hei 10-189996 and Japanese Patent Laid-Open No. Hei 7-161994 propose the irradiation of an ultraviolet ray to control the transistor threshold voltage instead of boron ion injection step which is employed in the manufacturing process of bottom gate low-temperature polysilicon TFT.

SUMMARY OF THE INVENTION

However, the problem with the above methods is that the potential difference between the signal lines and common wiring cannot be maintained below Vth of the switching element at all times. This leads to a leakage current flowing between the signal lines and common wiring via the switching elements, thus making it impossible to minimize power consumption. The present invention has been accomplished in light of the foregoing problem. It is embodiments of the present invention to provide an electronic device which prevents reduction of the manufacturing yield and yet offers low power consumption.

According to an embodiment of the present invention there is provided an electronic device which includes an active matrix region. The active matrix region includes a plurality of scan lines, a plurality of signal lines and pixel transistors disposed on a substrate. The plurality of scan lines and plurality of signal lines are disposed to intersect each other. The pixel transistors are each connected to one of the intersections between the plurality of scan lines and plurality of signal lines. The electronic device further includes a short-circuit line disposed outside of the active matrix region. The electronic device still further includes electrostatic protection elements each of which is connected between the short-circuit line and at least one of the scan and signal lines. The electronic device still further includes a light-shielding film provided outside of the active matrix region. The light-shielding film has openings at portions associated with the electrostatic protection elements.

As described above, the electronic device according to the embodiment of the present invention has the electrostatic protection elements each of which is connected between at least one of the scan and signal lines and short-circuit line. The light-shielding film provided outside of the active matrix region has openings. This permits selective irradiation of an ultraviolet ray or laser beam onto the electrostatic protection elements via the openings. As a result, the characteristic of the electrostatic protection elements can be altered so that the leakage current of the same elements is reduced when electrostatic protection is no longer necessary.

According to another embodiment of the present invention there is provided an electronic device manufacturing method which includes a step of forming an active matrix region, disposing a short-circuit line at the outer periphery of the active matrix region and forming electrostatic protection elements each between the short-circuit line and at least one of scan and signal lines. The active matrix region includes the plurality of scan lines, the plurality of signal lines and pixel transistors disposed on a substrate. The plurality of scan lines and plurality of signal lines are disposed to intersect each other. The pixel transistors are each connected to one of the intersections between the plurality of scan lines and plurality of signal lines. The electronic device manufacturing method further includes a step of selectively irradiating an ultraviolet ray or laser beam onto the electrostatic protection elements so as to reduce the leakage current of the same elements.

According to the embodiment of the present invention described above, the electrostatic protection elements are each provided between at least one of the scan and signal lines and the short-circuit line. The electrostatic protection elements are selectively irradiated with an ultraviolet ray or laser beam so that the characteristic thereof is altered, thus providing reduced leakage current of the same elements when electrostatic protection is no longer necessary. This ensures reduced power consumption of the electronic device.

According to yet another embodiment of the present invention there is provided an electronic apparatus having an electronic device in a housing. The electronic device includes an active matrix region. The active matrix region includes a plurality of scan lines, a plurality of signal lines and pixel transistors disposed on a substrate. The plurality of scan lines and plurality of signal lines are disposed to intersect each other. The pixel transistors are each connected to one of the intersections between the plurality of scan lines and plurality of signal lines. The electronic device further includes a short-circuit line disposed outside of the active matrix region. The electronic device still further includes electrostatic protection elements each of which is connected between the short-circuit line and at least one of the scan and signal lines. The electronic device still further includes a light-shielding film provided outside of the active matrix region. The light-shielding film has openings at portions associated with the electrostatic protection elements.

According to the embodiment of the present invention described above, the electronic apparatus includes the electronic device in which the electrostatic protection elements are each provided between at least one of the scan and signal lines and the short-circuit line. The light-shielding film, provided outside of the active matrix region, has openings. This allows the electrostatic protection elements to be selectively irradiated with an ultraviolet ray or laser beam via the openings. As a result, the characteristic of the electrostatic protection elements can be altered so that the leakage current of the same elements is reduced when electrostatic protection is no longer necessary.

According to the embodiments of the present invention, therefore, if a voltage is applied to the scan or signal line because of static electricity, electric charge can be dissipated in the direction in which the voltage is dissipated via the electrostatic protection element. This makes it possible to ensure reduced electrostatic destructions caused by electrification in the manufacturing process. Moreover, the characteristic of the electrostatic protection elements is altered when electrostatic protection is no longer necessary in a later step. This makes it possible to provide an electronic device which offers reduced leakage current and power consumption.

BRIEF DESCRIPTION OF THE DRAWINGS

FIGS. 10A and 10B are perspective views illustrating a digital camera to which an embodiment of the present invention is applied.

FIGS. 13A to 13G are views illustrating a mobile terminal device such as mobile phone to which an embodiment of the present invention is applied.

DETAILED DESCRIPTION OF THE PREFERRED EMBODIMENT

The preferred embodiment of the present invention will be described below with reference to the accompanying drawings. It should be noted that a TFT array having TFTs (Thin Film Transistors) formed in a matrix form will be taken as an example of the electronic device according to the present embodiment in the description given below.

<TFT Array>

Figure 1:
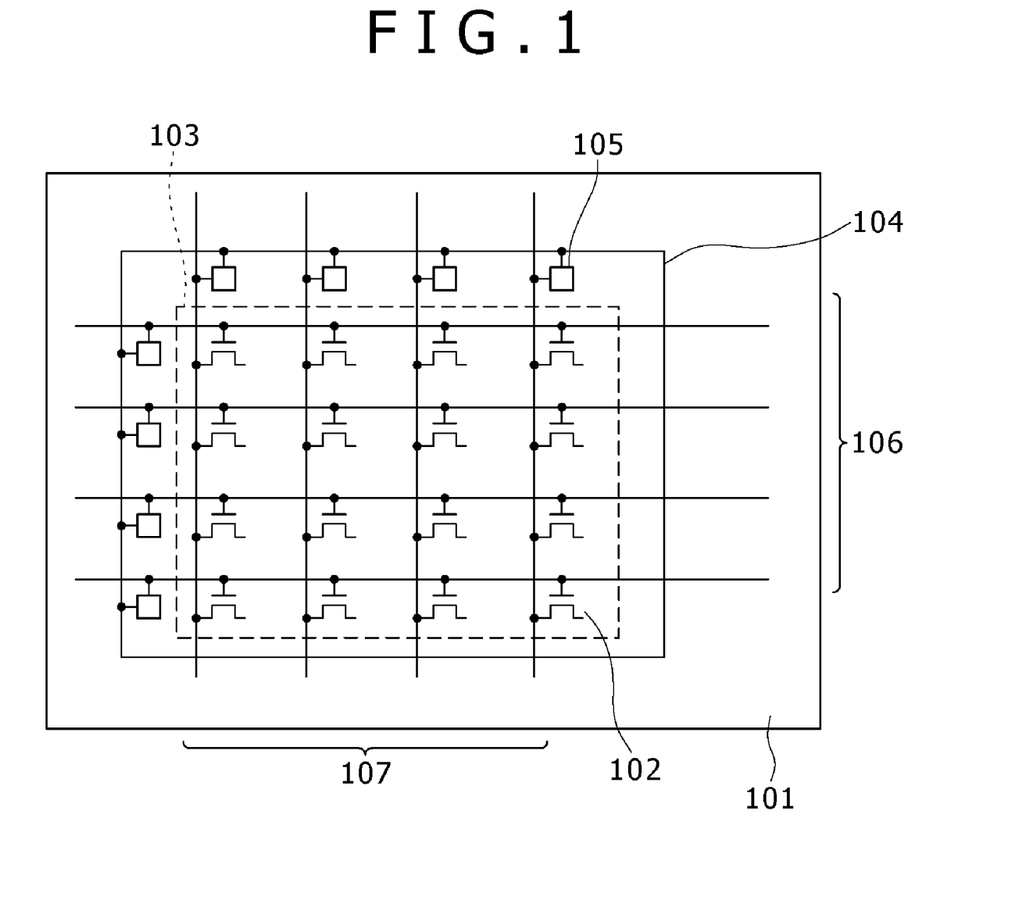
FIG. 1 is an equivalent circuit diagram illustrating the diagrammatic sketch of a TFT array.

FIG. 1 is an equivalent circuit diagram illustrating the diagrammatic sketch of the TFT array. In FIG. 1, the TFT array includes a plurality of scan lines 106, a plurality of signal lines 107, pixel TFTs 102 and display electrodes (not shown) on an insulating transparent substrate (TFT substrate) 101. The plurality of scan lines 106 and plurality of signal lines 107 are disposed to intersect each other. The pixel TFTs 102 are each connected to one of the intersections between the plurality of scan lines 106 and plurality of signal lines 107.

The display electrodes are connected to the pixel TFTs 102. The display electrodes are arranged in a matrix form to form an active matrix region (display region 103).

Figure 2:
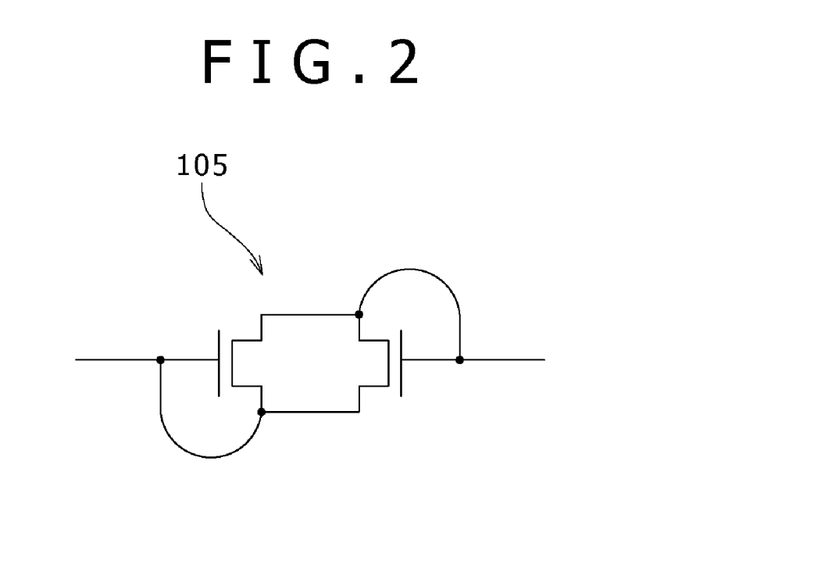
FIG. 2 is an equivalent circuit diagram illustrating the configuration of an electrostatic protection element.

A circumferential short-circuit line 104 is provided outside of the display region 103. The circumferential short-circuit line 104, scan lines 106 and signal lines 107 are connected to each other via electrostatic protection elements 105. The electrostatic protection elements 105 each include two TFTs as illustrated in FIG. 2. The TFTs making up the electrostatic protection element 105 are formed by the same step as that for the pixel TFTs 102 in the display region 103. The electrostatic protection elements 105 are disposed where they will not be cut off halfway through the manufacturing process.

It should be noted that the electrostatic protection element 105 may be provided between the circumferential short-circuit line 104 and at least one of the scan line 106 and signal line 107. However, the electrostatic protection element 105 should be preferably provided between the circumferential short-circuit line 104 and both of the scan line 106 and signal line 107.

Figure 3:
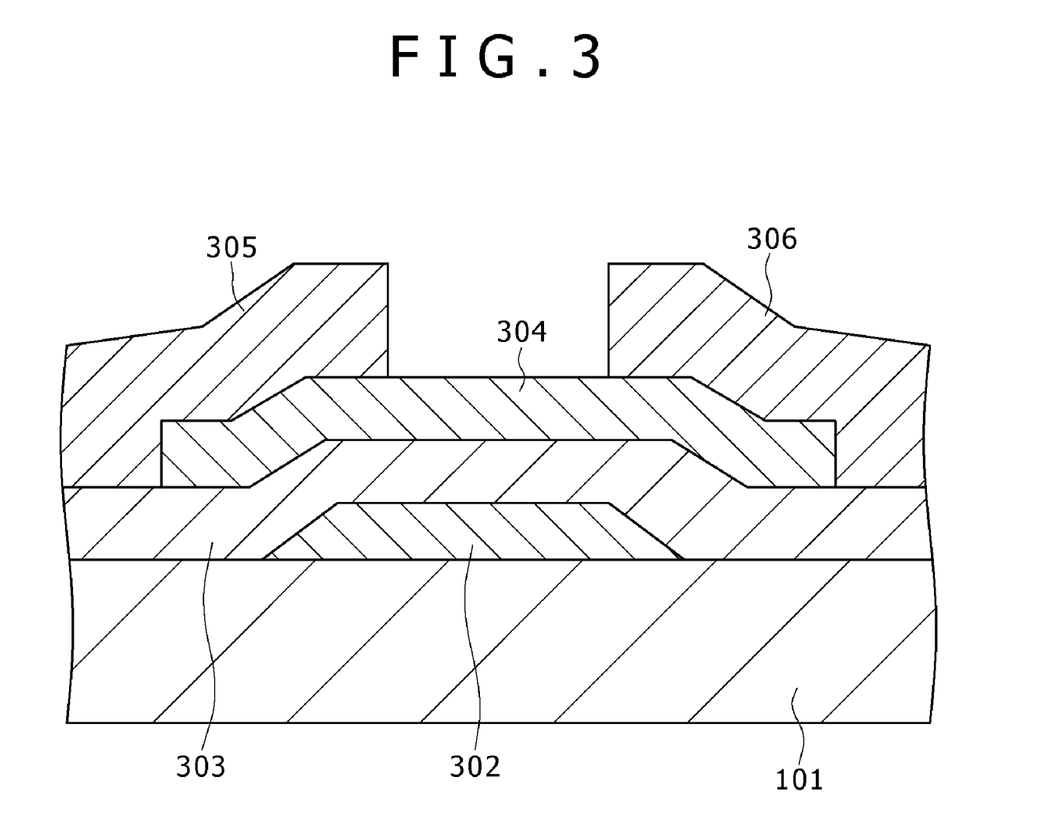
FIG. 3 is a schematic sectional view illustrating the structure of a TFT.

FIG. 3 is a schematic sectional view illustrating the structure of the pixel TFT shown in FIG. 1 and the TFT of the electrostatic protection element shown in FIG. 2. The TFT has a laminated structure in which a gate electrode 302, insulating layer 303, channel layer 304, source electrode 305 and drain electrode 306 are stacked one on top of another in the order from the closest to the insulating transparent substrate 101.

The gate electrode 302, source electrode 305 and drain electrode 306 are formed with a metallic material such as Al, AlNd, Mo and Ti. The insulating layer 303 is formed with an insulating material such as SiN and SiO. The channel layer 304 is formed with a semiconductor material such as amorphous silicon, microcrystalline silicon and polysilicon.

In the TFT configured as described above, the conductivity of the channel layer 304 changes with change in the electric field between the gate electrode 302 and source electrode 305. This changes the resistance between the drain electrode 306 and source electrode 305. That is, if a high voltage is applied to a wiring connected with the electrostatic protection element as illustrated in FIG. 2, the channel layer is brought into conduction. As a result, electric charge is discharged into the circumferential short-circuit line, thus protecting the TFT from electrostatic destruction.

<Light-Shielding Film>

Figure 4:
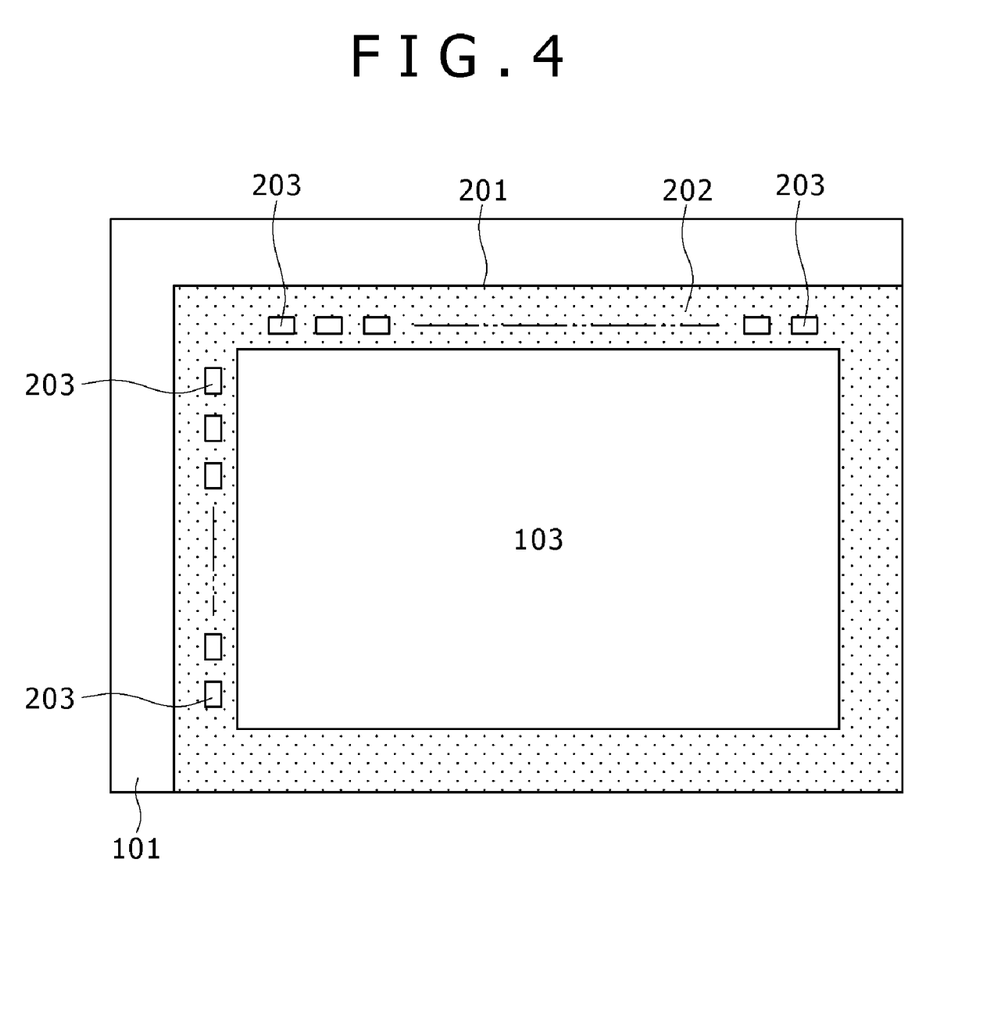
FIG. 4 is a schematic plan view describing a light-shielding film.

FIG. 4 is a schematic plan view describing the light-shielding film. A light-shielding film 202 is provided outside of the active matrix region (display region 103) of the electronic device according to the present embodiment to block undesired light.

The light-shielding film 202 is provided, for example, at an appropriate position on an opposed substrate 201 (e.g., opposed substrate having a common electrode and color filter in the case of a liquid crystal display device). The opposed substrate 201 is disposed to be opposed to the insulating transparent substrate 101 on which the TFTs are formed. In the present embodiment, the light-shielding film 202 has an opening 203 at the position associated with the electrostatic protection element. If the plurality of electrostatic protection elements are provided, the light-shielding film 202 has the openings 203 at the positions associated with the respective electrostatic protection elements.

Therefore, if an ultraviolet ray or laser beam is irradiated via the openings 203 of the light-shielding film 202, the electrostatic protection elements provided on the insulating transparent substrate 101 can be selectively irradiated with an ultraviolet ray or laser beam.

That is, if the openings 203 are provided at the portions of the light-shielding film 202 associated with the positions of the electrostatic protection elements, the electrostatic protection elements can be selectively irradiated with an ultraviolet ray or laser beam even in a later step after the light-shielding film 202 is disposed. This makes it possible to perform a step of reducing the leakage current of the electrostatic protection elements when electrostatic protection is no longer necessary.

<Manufacturing Method of the Electronic Device>

(First Manufacturing Method)

A manufacturing method of the electronic device according to the present embodiment will be described next. That is, the TFT array which is the electronic device according to the present embodiment is manufactured by the process described below.

First, molybdenum is formed on an insulating transparent substrate by sputtering, followed by the formation of a gate metal which will serve as a gate electrode by photolithography and etching. Then, a gate insulating layer and amorphous silicon layer are formed by plasma CVD. The gate insulating layer is made up of silicon nitride and silicon oxide stacked one on top of the other.

Next, a silicon nitride film is formed to serve as an etching stopper. Then, source and drain electrodes and a passivation film are formed to form etching stopper-type inverted staggered transistors (TFTs). The TFTs of the electrostatic protection elements are also formed together with the formation of the above TFTs.

Figure 5:
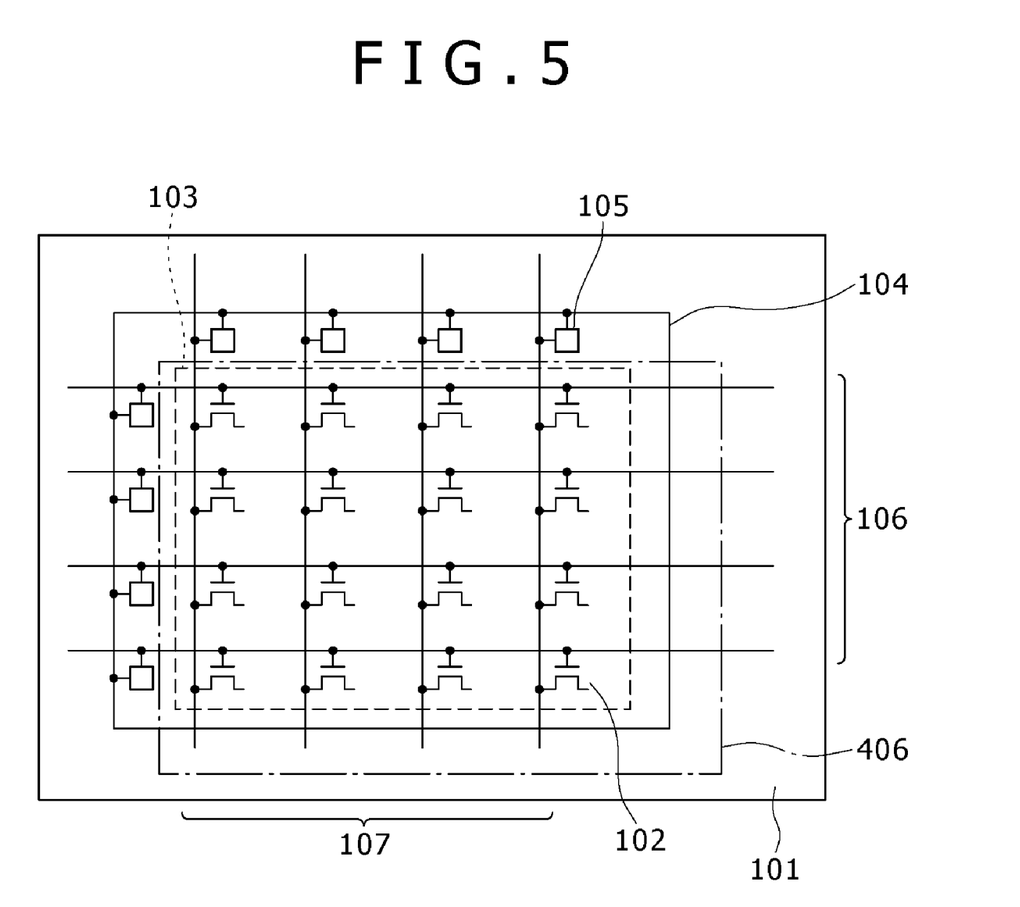
FIG. 5 is a schematic plan view describing a manufacturing method using a light-shielding mask.

After the formation of the TFTs arranged in an array form, the inside of the display region 103 is blocked from light by a photomask 406 as illustrated in FIG. 5. Then, the electrostatic protection elements 105 are irradiated with an ultraviolet ray using a low-pressure mercury lamp having peaks at 185 nm and 254 nm in wavelength of the light emission spectrum. This ensures that only the electrostatic protection elements 105 are selectively irradiated with an ultraviolet ray, and not the display region 103. This ultraviolet ray changes the characteristic of the electrostatic protection elements 105. Here, the leakage current of the same elements 105 is reduced to 1/10 or less as compared to before the irradiation.

Figure 6:
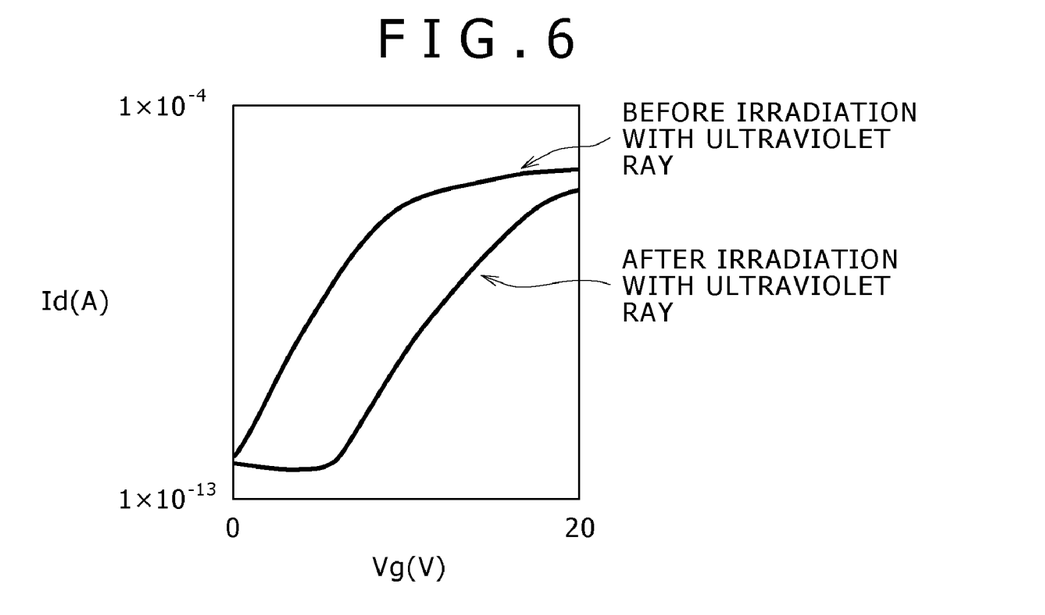
FIG. 6 is a characteristic diagram 1 illustrating the Id-Vg characteristic of the TFT alone which makes up the electrostatic protection element.

The Id-Vg characteristic of the TFT alone which makes up the electrostatic protection element changes after the irradiation with an ultraviolet ray as compared to before the irradiation, as illustrated in FIG. 6. That is, it is clear that the leakage current of the electrostatic protection element has been reduced as a result of increase in the TFT threshold voltage by about 5V as compared to before the irradiation with an ultraviolet ray.

(Second Manufacturing Method)

A second manufacturing method will be described next. First, TFTs in an array form and electrostatic protection elements are formed on an insulating transparent substrate by the same step as for the first manufacturing method. Then, a laser beam of 355 nm in wavelength is shaped, for example, by a slit having an opening of 100 μm by 100 μm. The shaped beam is then scanned onto the electrostatic protection elements, formed together with the TFTs in an array form, so that the irradiated energy density is 1 J/cm$^2$. As a result, the electrostatic protection elements 105 are selectively irradiated with the laser beam, thus altering the characteristic of the same elements 105. Here, the leakage current of the electrostatic protection elements 105 is reduced to 1/10 or less as compared to before the irradiation.

Figure 7:
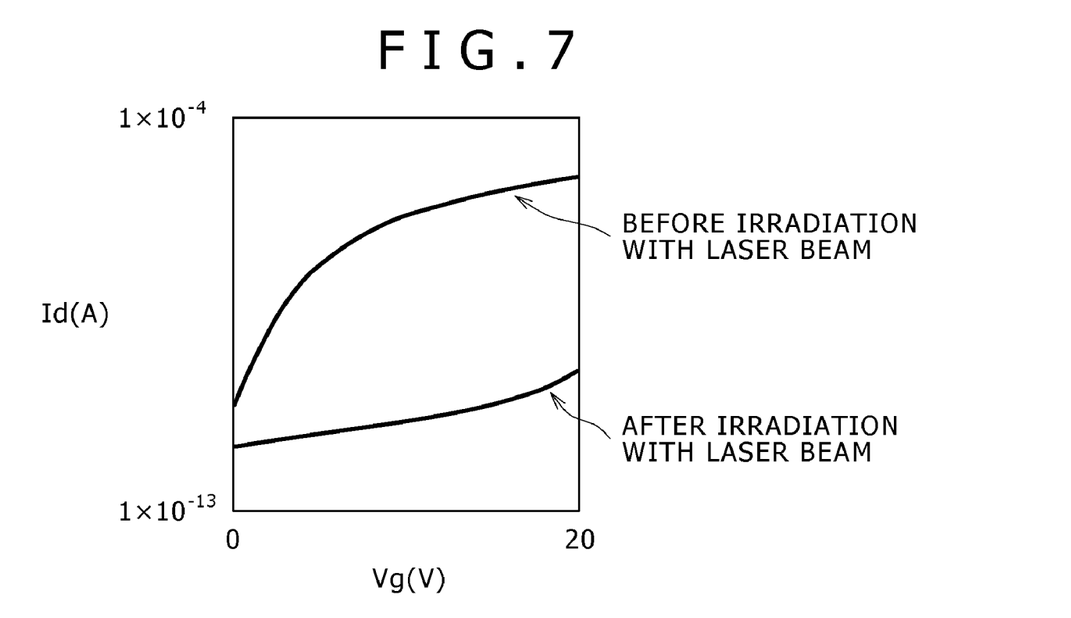
FIG. 7 is a characteristic diagram 2 illustrating the Id-Vg characteristic of the TFT alone which makes up the electrostatic protection element.

The Id-Vg characteristic of the TFT alone which makes up the electrostatic protection element changes after the irradiation with the laser beam as compared to before the irradiation, as illustrated in FIG. 7. That is, it is clear that the leakage current of the electrostatic protection element has been reduced as a result of reduction of the TFT mobility due to irradiation with the laser beam.

It should be noted that the irradiation with an ultraviolet ray and laser beam described in the above manufacturing methods do not necessarily be performed after the formation of the TFTs in an array form is complete. The same effect can be achieved if the irradiation is performed in the cell or module step after the attachment of the opposed substrate, which is used for a liquid crystal display or organic EL display, is completed.

Here, the term "cell step" refers to the step in which a cell is formed. A cell (into which liquid crystal is filled between the substrates in the case of a liquid crystal display device) includes a substrate having a TFT array formed thereon (TFT substrate) and opposed substrate attached together by a sealing agent. In contrast, the term "module step" refers to the step in which a module is formed. A module includes the cell formed in the cell step, external circuitry connected to the cell and a frame (bezel) attached to the cell.

On the other hand, if a color filter is used as the opposed substrate, the electronic device may be manufactured as follows. That is, openings are provided at desired positions of the black matrix (light-shielding film). After the TFT substrate and color filter substrate (opposed substrate) are attached together, an ultraviolet ray or laser beam is irradiated via the openings from the side of the color filter substrate so as to irradiate the electrostatic protection elements. Further, this ultraviolet ray irradiation may be performed in the cell step to also harden the sealing agent (treatment to harden the ultraviolet-ray-hardening sealing agent adapted to attach the TFT and color filter substrates together).

Thus, the manufacturing methods allow for irradiation of only the selected areas with an ultraviolet ray or laser beam. This changes the characteristic of only the electrostatic protection elements (reduced leakage current) without changing the characteristic of the pixel TFTs, thus providing reduced power consumption.

APPLICATION EXAMPLES

Figure 8:
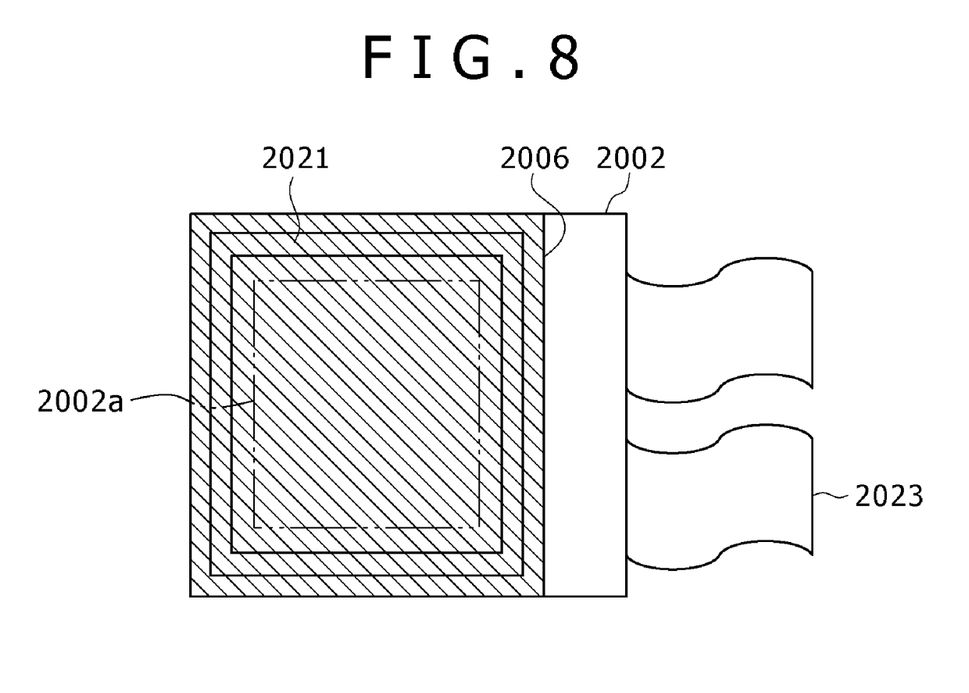
FIG. 8 is a configuration diagram illustrating a display device in a modular form having a sealed configuration to which an embodiment of the present invention is applied.

The electronic device according to the present embodiment includes that in a modular form having a sealed configuration as disclosed in FIG. 8. Such an electronic device corresponds to a display module which is formed as follows. That is, the display module is formed by providing a sealing section 2021 so as to enclose a display region 2002a which is a pixel array section. Then, the display region 2002a is attached to an opposed section (sealing substrate 2006) made, for example, of transparent glass using the sealing section 2021 as an adhesive.

A color filter, protective film, light-shielding film or other film may be provided on the transparent opposed substrate 2006. It should be noted that a flexible printed substrate 2023 may be provided on a substrate 2002 which has the display region 2002a formed thereon and serves as the display module. The flexible printed substrate 2023 allows input and output of signals or other information between external device and the display region 2002a (pixel array section).
<Various Types of Electronic Apparatus>

The electronic device described above is applicable as a display of electronic apparatus across all fields including a digital camera, laptop personal computer, mobile terminal device such as mobile phone and video camera. These apparatuses are designed to display an image or video of a video signal fed to or generated inside the electronic apparatus.

Examples of electronic apparatus to which the embodiment of the present invention is applied will be described below.

Figure 9:
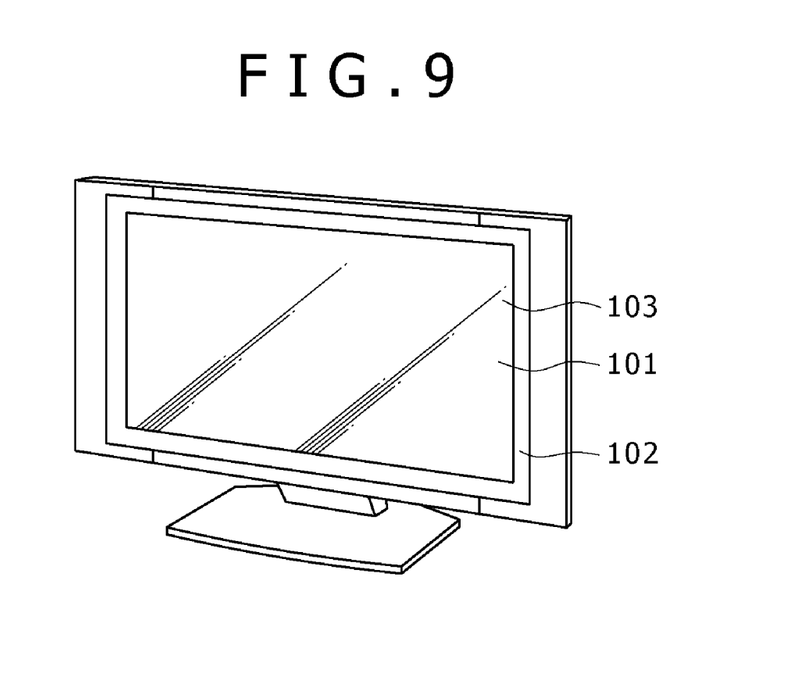
FIG. 9 is a perspective view illustrating a television set to which an embodiment of the present invention is applied.

FIG. 9 is a perspective view illustrating a television set to which the embodiment of the present invention is applied. The television set according to the present application example includes a video display screen section 101 made up, for example, of a front panel 102, filter glass 103 and other parts. The television set is manufactured by using the electronic device manufactured according to the embodiment of the present invention as the video display screen section 101.

Figure 10A:
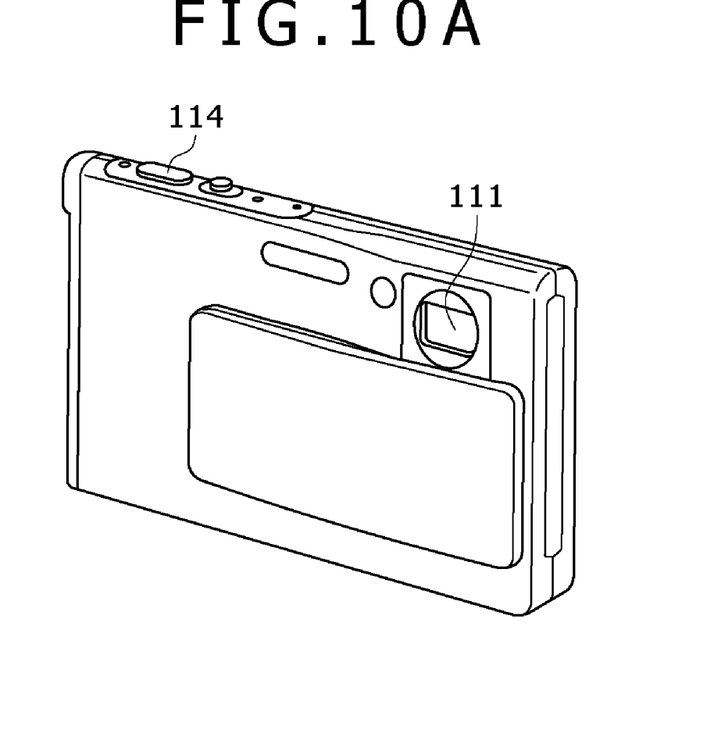
FIG. 10A is a perspective view as seen from the front.
Figure 10B:
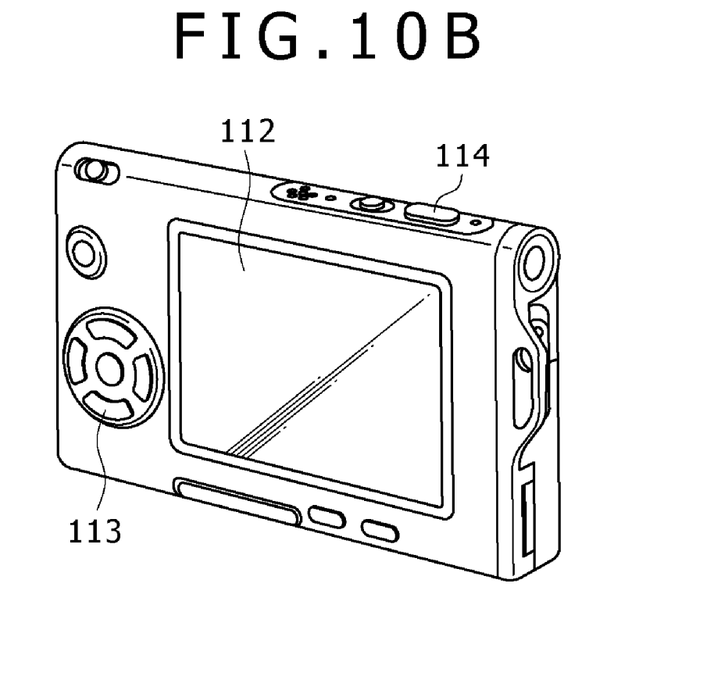
FIG. 10B is a perspective view as seen from the rear.

FIGS. 10A and 10B are views illustrating a digital camera to which the embodiment of the present invention is applied. FIG. 10A is a perspective view of the digital camera as seen from the front, and FIG. 10B is a perspective view thereof as seen from the rear. The digital camera according to the present application example includes a flash-emitting section 111, display section 112, menu switch 113, shutter button 114 and other parts. The digital camera is manufactured by using the electronic device manufactured according to the embodiment of the present invention as the display section 112.

Figure 11:
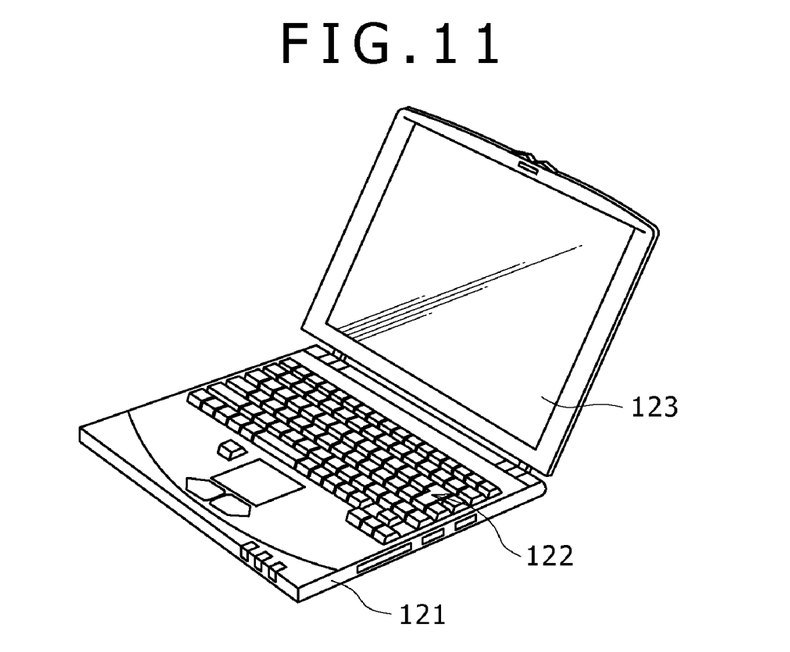
FIG. 11 is a perspective view illustrating a laptop personal computer to which an embodiment of the present invention is applied.

FIG. 11 is a perspective view illustrating a laptop personal computer to which the embodiment of the present invention is applied. The laptop personal computer according to the present application example includes, in a main body 121, a keyboard 122 adapted to operate for entry of text or other information, a display section 123 adapted to display an image, and other parts. The laptop personal computer is manufactured by using the electronic device manufactured according to the embodiment of the present invention as the display section 123.

Figure 12:
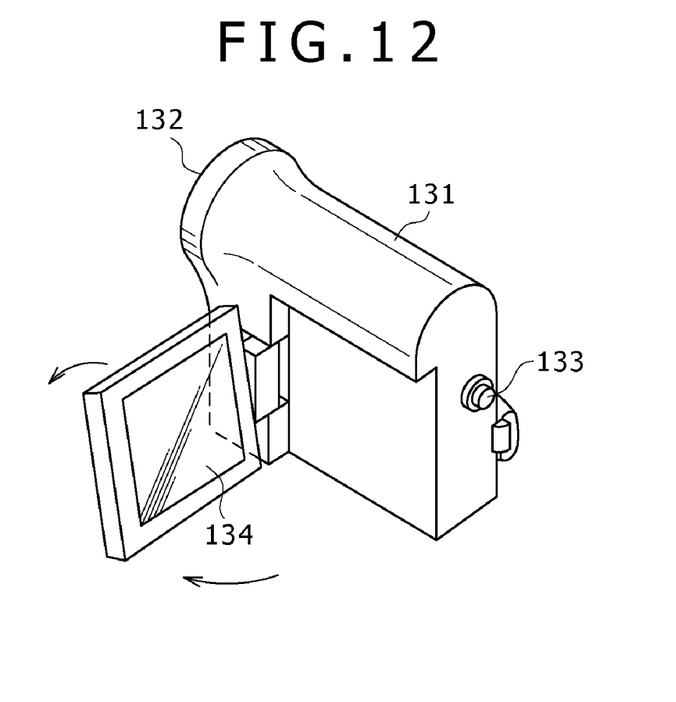
FIG. 12 is a perspective view illustrating a video camera to which an embodiment of the present invention is applied.

FIG. 12 is a perspective view illustrating a video camera to which the embodiment of the present invention is applied. The video camera according to the present application example includes a main body section 131, lens 132 provided on the front-facing side surface to image the subject, imaging start/stop switch 133, display section 134 and other parts. The video camera is manufactured by using the electronic device manufactured according to the embodiment of the present invention as the display section 134.

Figure 13A:
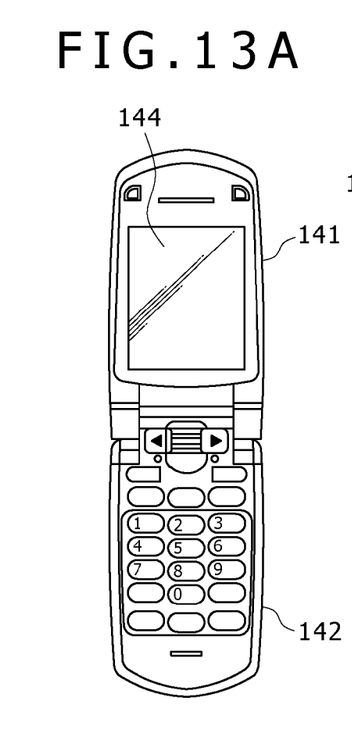
FIG. 13A is a front view of the mobile phone in an open position.
Figures 13B, 13D:
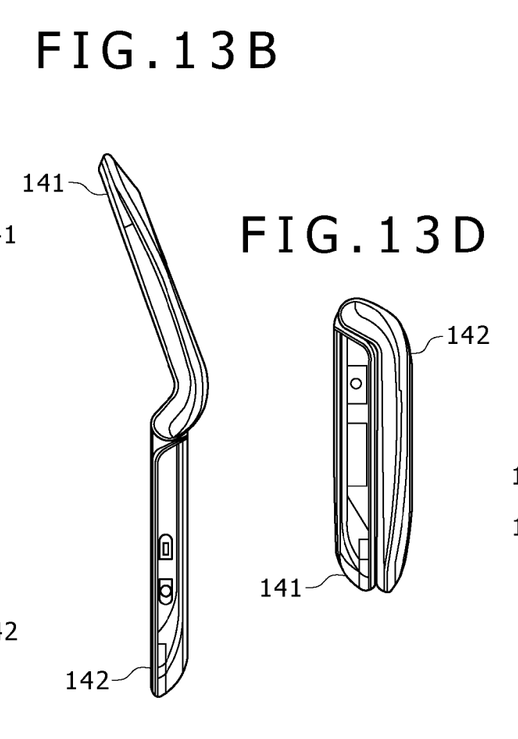
FIG. 13B is a side view thereof.
FIG. 13D is a left side view thereof.
Figure 13C:
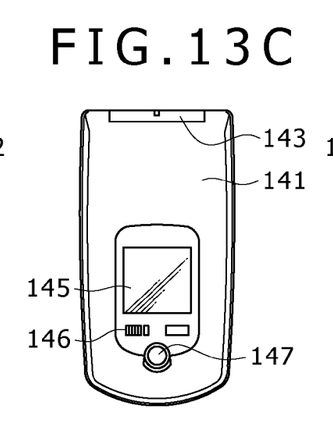
FIG. 13C is a front view thereof in a closed position.
Figure 13E:
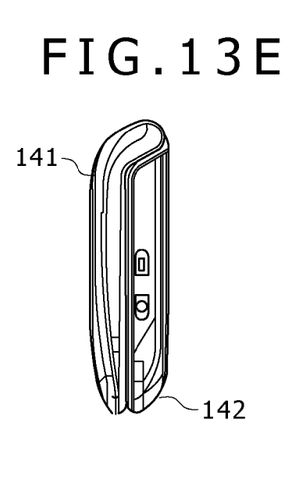
FIG. 13E is a right side view thereof.
Figure 13F:
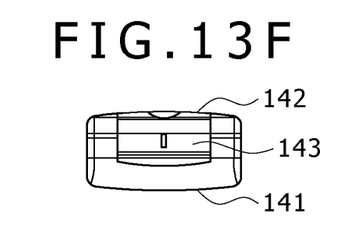
FIG. 13F is a top view thereof.
Figure 13G:
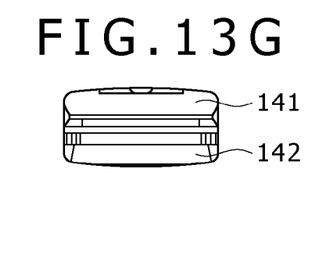
FIG. 13G is a bottom view thereof.

FIGS. 13A to 13G are perspective views illustrating a mobile terminal device such as mobile phone to which the embodiment of the present invention is applied. FIG. 13A is a front view of the mobile phone in an open position. FIG. 13B is a side view thereof. FIG. 13C is a front view of the mobile phone in a closed position. FIG. 13D is a left side view. FIG. 13E is a right side view. FIG. 13F is a top view. FIG. 13G is a bottom view. The mobile phone according to the present application example includes an upper housing 141, lower housing 142, connecting section (hinge section in this example) 143, display 144, subdisplay 145, picture light 146, camera 147 and other parts. The mobile phone is manufactured by using the electronic device manufactured according to the present invention as the display 144 and subdisplay 145.

Figure 14:
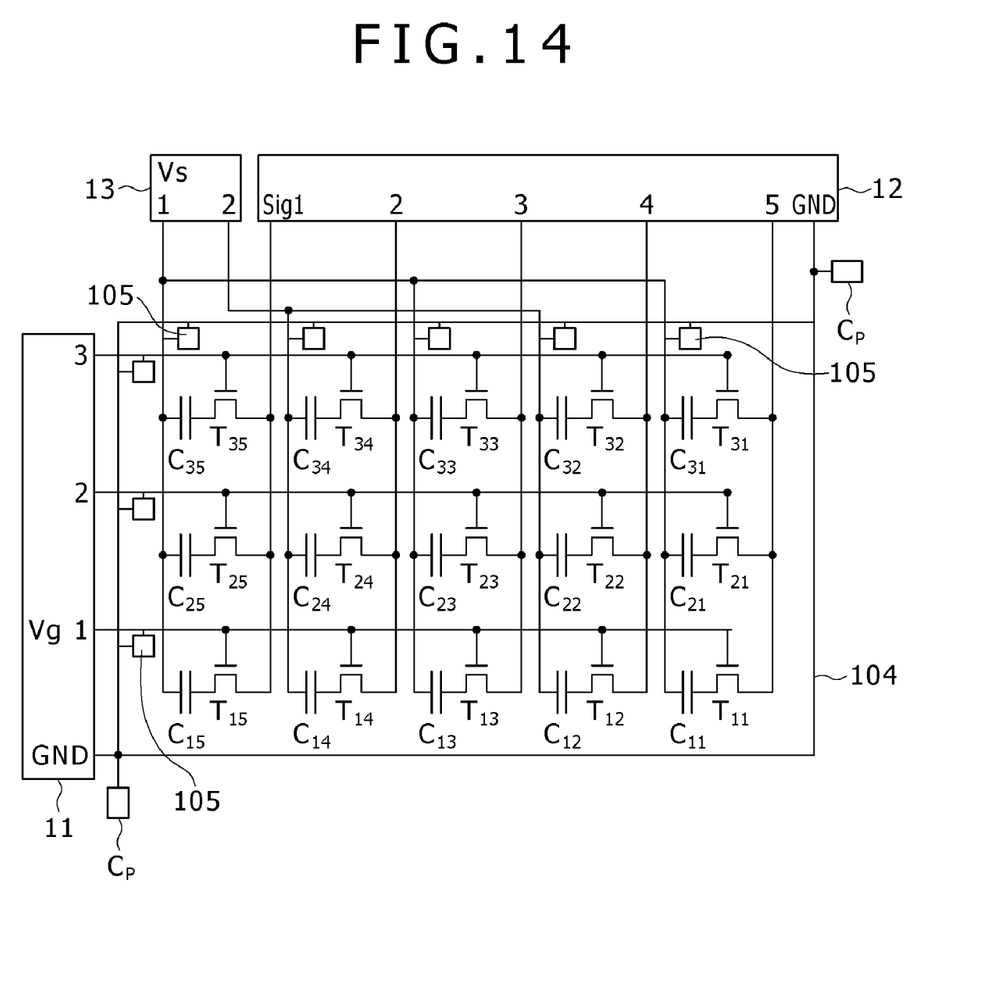
FIG. 14 is an equivalent circuit diagram illustrating the diagrammatic sketch of an imaging device to which an embodiment of the present invention is applied.

FIG. 14 is a view illustrating an example of imaging device to which the electronic device manufactured according to the embodiment of the present invention is applied. The imaging device includes a TFT array manufactured as the electronic device according to the embodiment of the present invention. MIS (Metal Insulator Semiconductor) photosensors are connected to the TFTs in the TFT array.

The imaging device illustrated in FIG. 14 includes a TFT driver 11, signal processor/amplifier 12, MIS photosensor driver 13 and MIS photosensors C11 to C35. In FIG. 11, on the other hand, reference numerals T11 to T35 are TFTs, Vg1 to Vg3 TFT drive wirings, Sig1 to Sig5 signal wirings, and Vs1 and Vs2 bias wirings.

The MIS photosensors C11 to C35 receive optical signals applied from the driver 13 to the bias wirings Vs1 and Vs2. The electric charge of the optical signals is stored in the MIS photosensors. The stored electric charge is read out sequentially from the signal lines Sig1 to Sig5 by the TFTs (T11 to T35) via the signal processor/amplifier. On the other hand, the TFTs turn ON or OFF in response to a signal supplied from the TFT driver 11 via the TFT drive wirings Vg1 to Vg3.

In the embodiments of the present invention, the circumferential short-circuit line 104 is provided outside of the region where the TFTs are formed in a matrix form. The electrostatic protection elements 105 are provided between the TFT drive wirings Vg1 to Vg3 and circumferential short-circuit line 104 and between the signal wirings Sig1 to Sig5 and circumferential short-circuit line 104.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic device comprising:
   an active matrix region having a plurality of scan lines, a plurality of signal lines on a substrate, and pixel transistors, the plurality of scan lines and plurality of signal lines being disposed to intersect each other, and each of the pixel transistors being connected to one of the intersections between the plurality of scan lines and plurality of signal lines;
   a circumferential short-circuit line outside the active matrix region;
   electrostatic protection elements outside the active matrix region; and
   a light-shielding film outside the active matrix region, wherein,
      the light-shielding film has openings at portions corresponding to the electrostatic protection elements such that an ultraviolet ray or laser beam can be irradiated onto the electrostatic protection elements, and
      the circumferential short-circuit line is connected to the scan lines and the signal lines via the electrostatic protection elements.

2. The electronic device of claim 1 comprising:
   an opposed substrate disposed to be opposed to the substrate,
   wherein the light-shielding film is on the opposed substrate.

3. An electronic device manufacturing method comprising the steps of:
   forming an active matrix region having a plurality of scan lines, a plurality of signal lines on a substrate, and pixel transistors, the plurality of scan lines and plurality of signal lines being disposed to intersect each other, and each of the pixel transistors being connected to one of the intersections between the plurality of scan lines and plurality of signal lines;
   disposing a circumferential short-circuit line at the outer periphery of the active matrix region and forming electrostatic protection elements at the outer periphery of the active matrix region;
   attaching an opposed substrate to the substrate on which the electrostatic protection elements are formed; and
   selectively irradiating an ultraviolet ray or laser beam onto the electrostatic protection elements so as to reduce a leakage current of the electrostatic protection elements, wherein,
      a light-shielding film is on the opposed substrate and has openings at portions corresponding to the electrostatic protection elements such that an ultraviolet ray or laser beam can be irradiated onto the electrostatic protection elements, and
      the circumferential short-circuit line is connected to the scan lines and the signal lines via the electrostatic protection elements.

4. An electronic apparatus having an electronic device in a housing, the electronic device comprising:
   an active matrix region having a plurality of scan lines, a plurality of signal lines on a substrate and pixel transistors, the plurality of scan lines and plurality of signal lines being disposed to intersect each other, and each of the pixel transistors being connected to one of the intersections between the plurality of scan lines and plurality of signal lines;
   a circumferential short-circuit line outside the active matrix region;
   electrostatic protection elements outside the active matrix region; and
   a light-shielding film outside the active matrix region, wherein,
      the light-shielding film has openings at portions corresponding to the electrostatic protection elements such that an ultraviolet ray or laser beam can be irradiated onto the electrostatic protection elements, and
      the circumferential short-circuit line is connected to the scan lines and the signal lines via the electrostatic protection elements.

* * * * *